(12) United States Patent
Kuo

(10) Patent No.: US 6,896,525 B2
(45) Date of Patent: May 24, 2005

(54) IC TESTER SOCKET WITH FLEXIBLE CONTACT POINTS

(75) Inventor: Ying-Fan Kuo, Tau Yuan (TW)

(73) Assignee: Eutrend Technology Inc., Hsinchu (TW)

( * ) Notice: Subject to any disclaimer, the term of this patent is extended or adjusted under 35 U.S.C. 154(b) by 105 days.

(21) Appl. No.: 10/319,883

(22) Filed: Dec. 16, 2002

(65) Prior Publication Data

US 2004/0115964 A1 Jun. 17, 2004

(51) Int. Cl.$^7$ .............................................. H01R 9/09
(52) U.S. Cl. ........................... 439/72; 439/73; 439/331
(58) Field of Search .............................. 439/72, 73, 91, 439/70, 71; 324/755, 754, 158; 361/820, 761

(56) References Cited

U.S. PATENT DOCUMENTS 5,347,215 A * 9/1994 Armstrong et al. ...... 324/158.1
5,841,640 A * 11/1998 Shibata ........................ 361/820
5,847,572 A * 12/1998 Iwasaki et al. .............. 324/755
5,975,915 A * 11/1999 Yamazaki et al. ............. 439/72
6,072,322 A * 6/2000 Viswanath et al. .......... 324/754

* cited by examiner

*Primary Examiner*—Alex Gilman
(74) *Attorney, Agent, or Firm*—H. C. Lin Patent Agent

(57) ABSTRACT

A socket for testing integrated circuit has opposite cantilever probing pads hinged at the far ends of the cantilevers to a circuit board. The leads of the IC are pressed over the free nearer ends of the cantilevers. Cushions are inserted under the two free nearer ends of the cantilevers to absorb in the pressure of the IC leads. For in-line lead IC packages, a common cushion can be used for each line of leads. Metallic pedestals can be mounted on the between the nearer ends of the cantilever and touching the IC under test for heat sinking and common ground. The pedestals can be inserted through the circuit board from a base plate at the bottom of the circuit board.

6 Claims, 8 Drawing Sheets

IC TESTER SOCKET WITH FLEXIBLE CONTACT POINTS

BACKGROUND OF THE INVENTION (1) Field of the Invention

This invention relates integrated circuit (IC) tester, particularly to the testing socket of the tester.

(2) Brief Description of Related Art

FIG. 1 shows a cross-section view of a prior art testing socket for ICs. The socket is mounted on a circuit board 12. Two or more printed circuit pads 13 lay over the circuit board 12.The leads 11 of the IC 10 under test are in contact with contact points 17 of the pads 13. The contact points may be flat or protruded as shown in FIG. 1. The top view of the socket is shown in FIG. 2. The pads 13 are two cantilevers, hinged to the circuit board 12 at the near ends of the two cantilever pads 13. Since the contact points 17 are located vertically on top of the hinges of the cantilever 13, the contact points 17 do not yield when the leads of the IC 10 under test are pressed on the contact points. Due to wear and tear of repeated testing, the contact points 17 tend to wear out.

SUMMARY OF THE INVENTION

An object of this invention is to prevent the wear and tear of the contact points of an IC test socket. Another object of this invention is to provide a heat sink for the IC under test. Still another object of this invention is to provide a ground connection for the IC under test.

These objects are achieved by providing a cushion under each testing pad. Two probing pads are constructed with opposite cantilever beams hinged at the far ends, and inserted with a flexible cushion under the cantilever beams at the near ends. The leads of the IC are pressed against the tops of the cantilever beams at the near ends. The flexible cushion is made of elastic material to absorb the pressure of the IC leads of the IC under test. A metal block may be mounted between the testing pads to serve as a heat sink or ground for the IC under test.

DETAILED DESCRIPTION OF THE INVENTION

Figure 1:
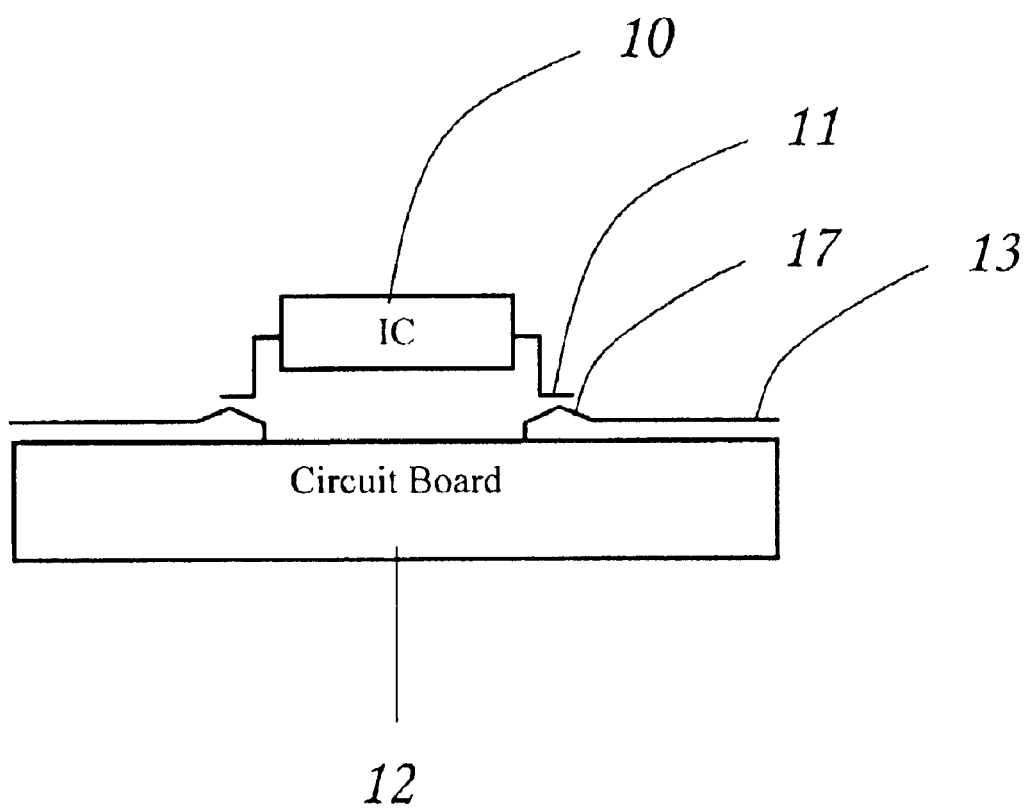
FIG. 1 shows the cross-section of a prior art IC test socket.
Figure 2:
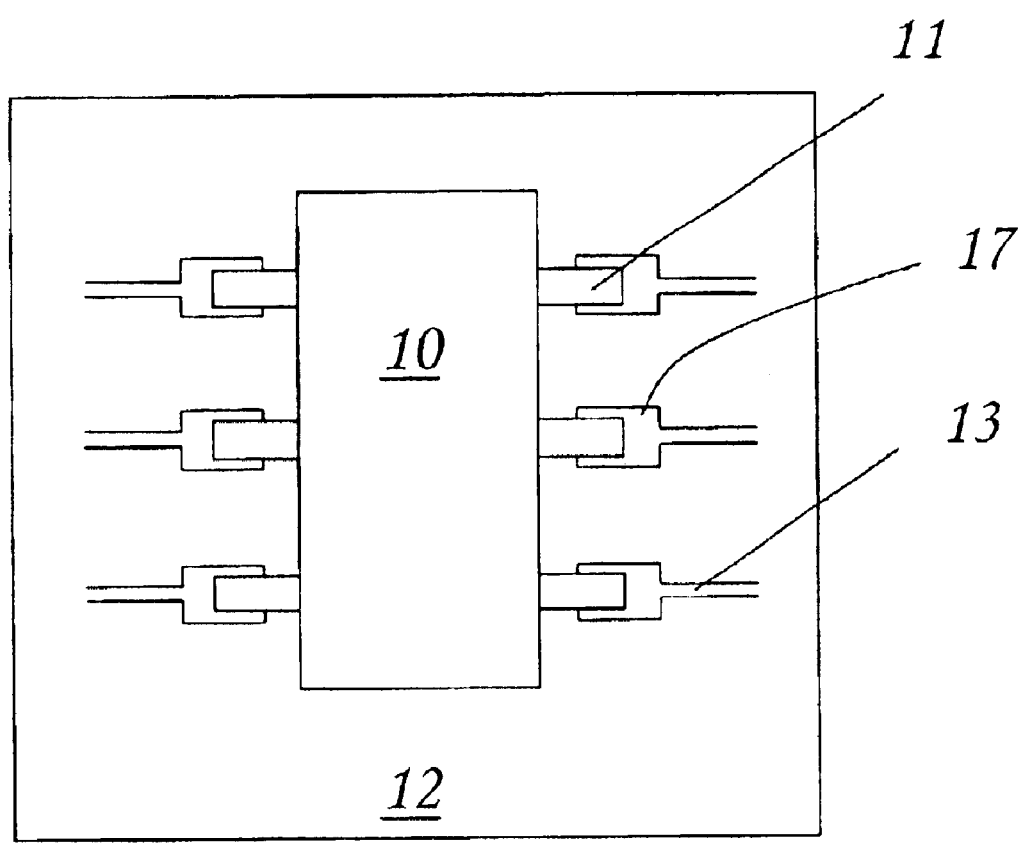
FIG. 2 shows the top view of the prior art IC test socket shown in FIG. 1.
Figure 3:
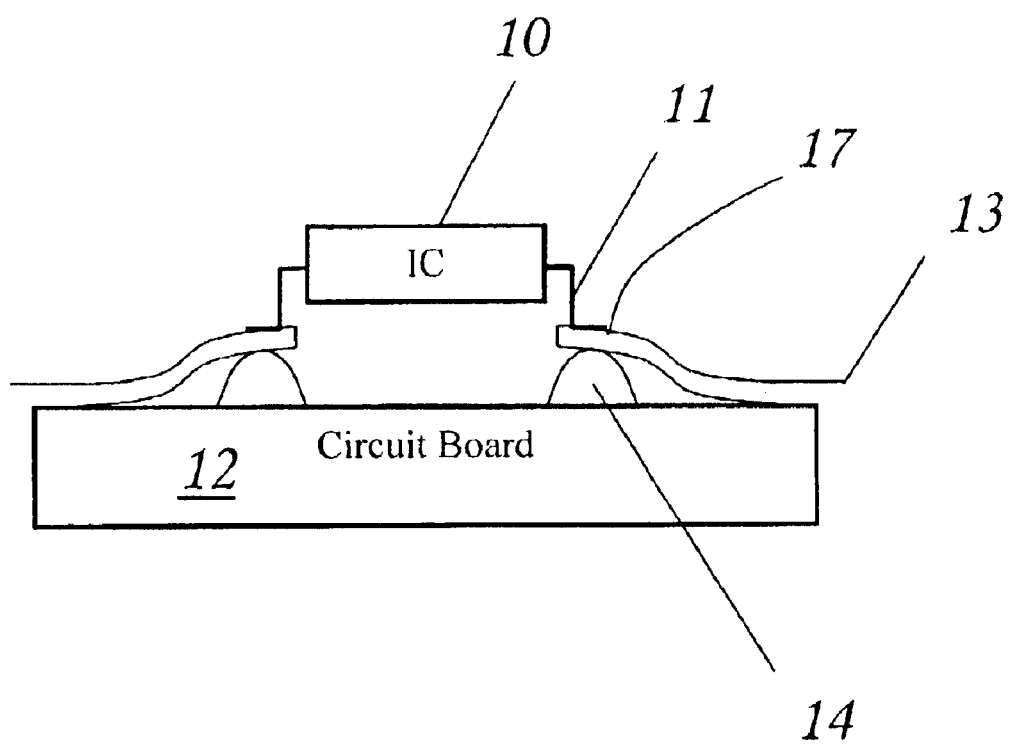
FIG. 3 shows the cross-section view of the basic structure of the present invention.

FIG. 3 shows the basic structure of this invention. Two metallic cantilever pads 13 are mounted on a circuit board 12, and hinged at the far ends away from each other. The top surfaces of the free near ends 17 of the cantilever pads 13 are in contact with the leads 11 of an IC 10 under test. Between the ends 17 and the circuit board 12 are inserted with cushions 14. When the IC leads 11 are pressed against the ends 17, the elasticity of the cushions 14 yields to the pressure, and the leads do not wear out the contacts 17. Thus the life of the pads 13 is prolonged. The cushion material can be rubber, plastic or any elastic material.

Figure 4:
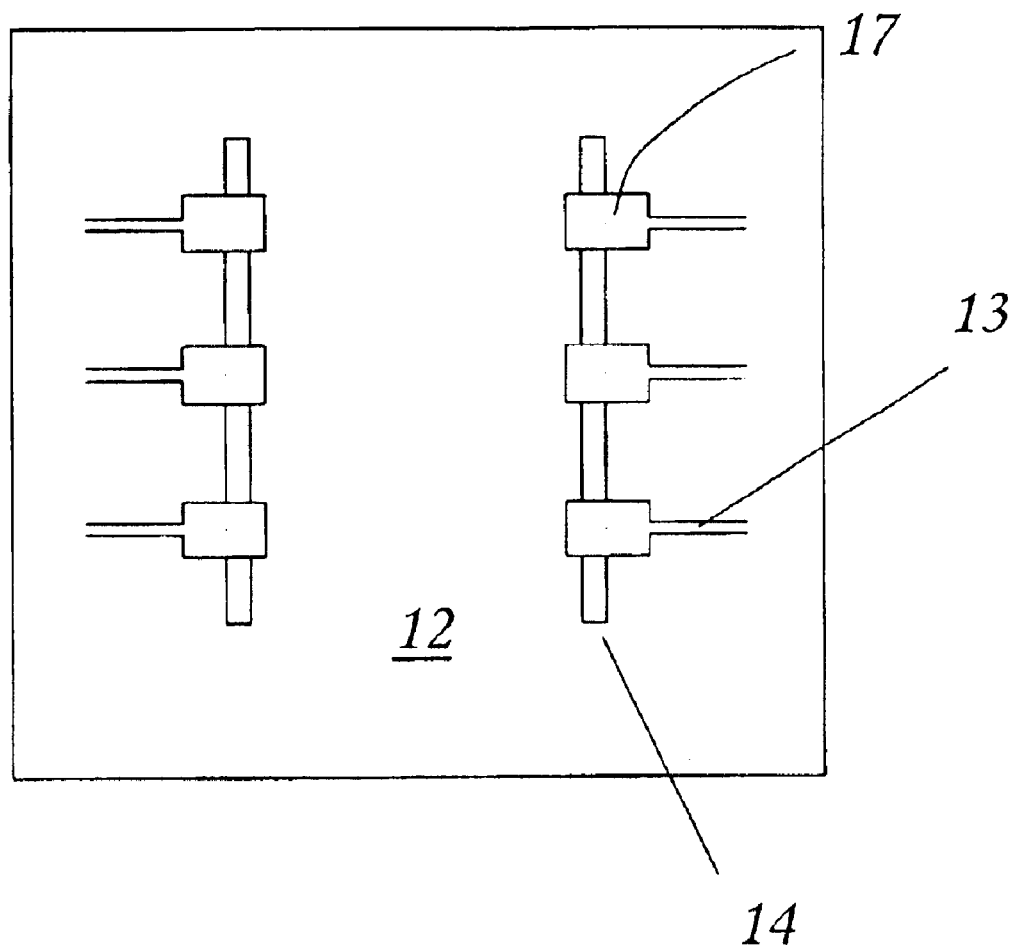
FIG. 4 shows the top view of the structure shown in FIG. 3

FIG. 4 shows the top view of the structure shown in FIG. 3. In this view, the substrate 12 is provided with multiple testing pads 13 with contacts 17 for mating with an IC with more than two leads. Since most ICs have in-line leads, a common cushion 14 can run under the contacts to absorb the pressure of the IC leads.

Figure 5:
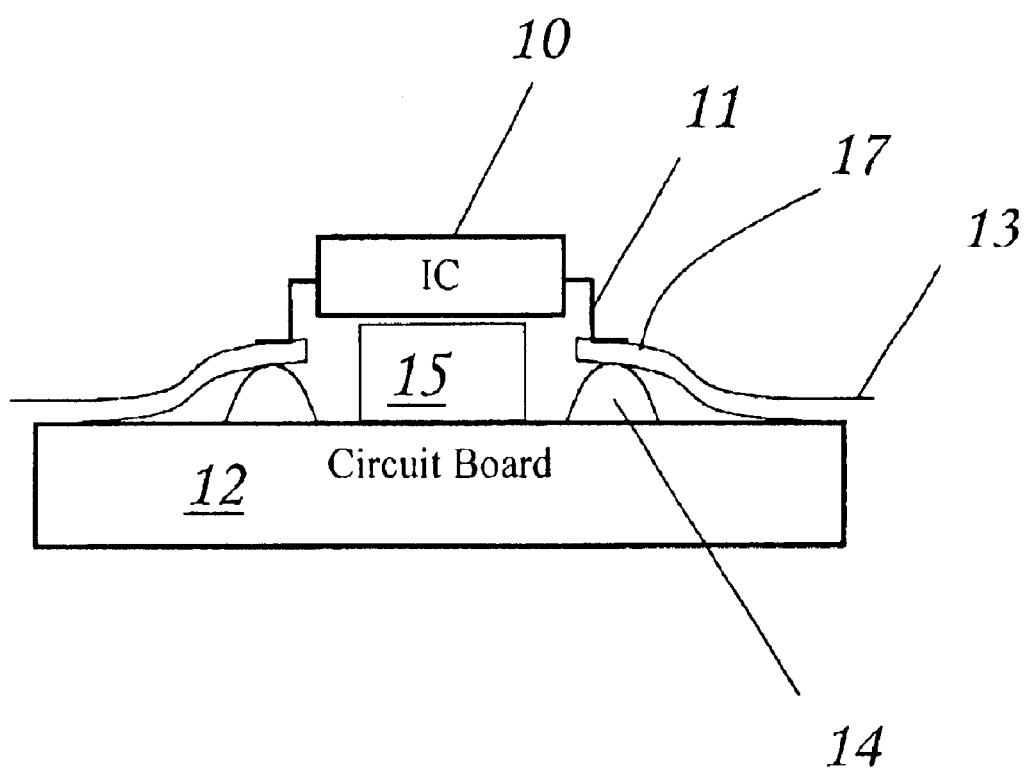
FIG. 5 shows cross-section of a second embodiment of the present invention with a metal pedestal mounted between the testing pads for heat sinking and grounding.

FIG. 5 shows a second embodiment of the present invention. In addition to the basic structure shown in FIG. 3, a metallic pedestal 15 is inserted between the cushions 14 and bonded to the circuit board 12. The metallic pedestal 15 is in contact with the IC 10 under test to serve as a heat sink and a ground connection.

Figure 6:
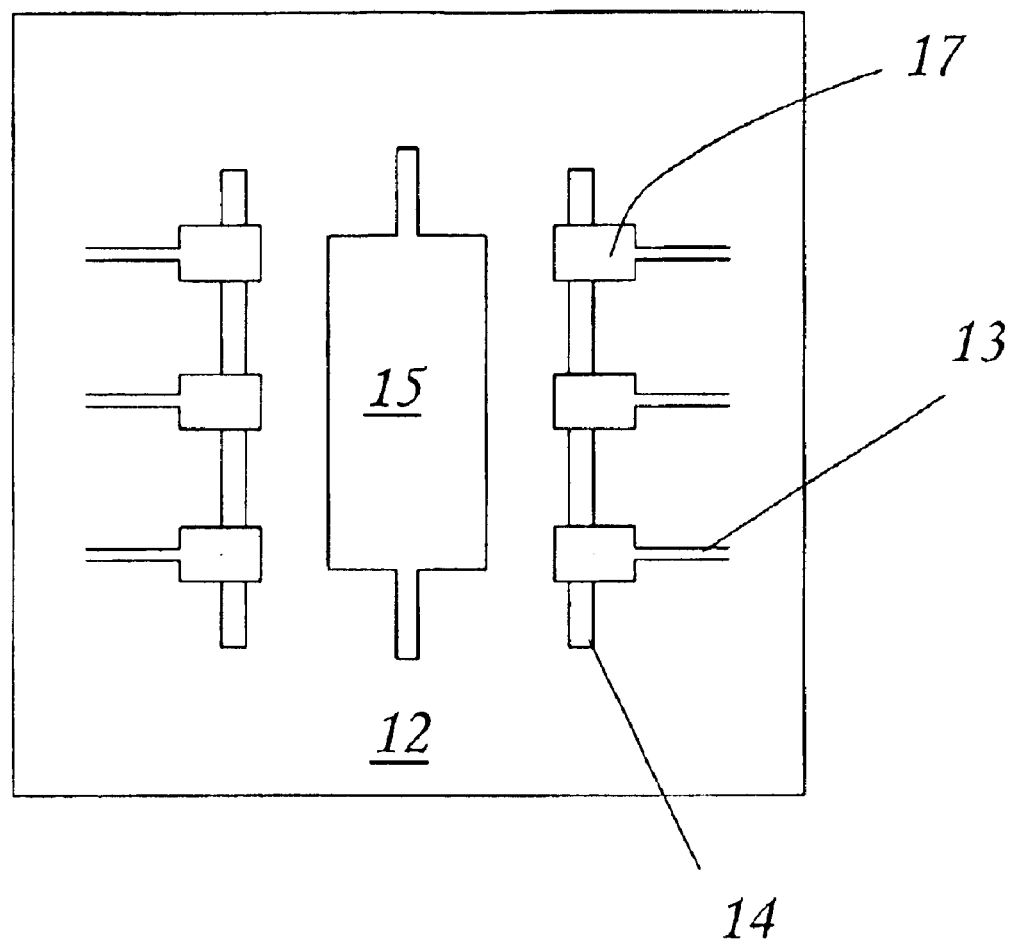
FIG. 6 shows the top view of the structure shown in FIG. 5.

FIG. 6 shows the top view of the structure shown in FIG. 5. A common pedestal 15 is mounted on the circuit board 12. Since the pedestal 15 serves as a heat sink and a common ground, pedestal 15 shown in FIG. 5 need not be separated.

Figure 7:
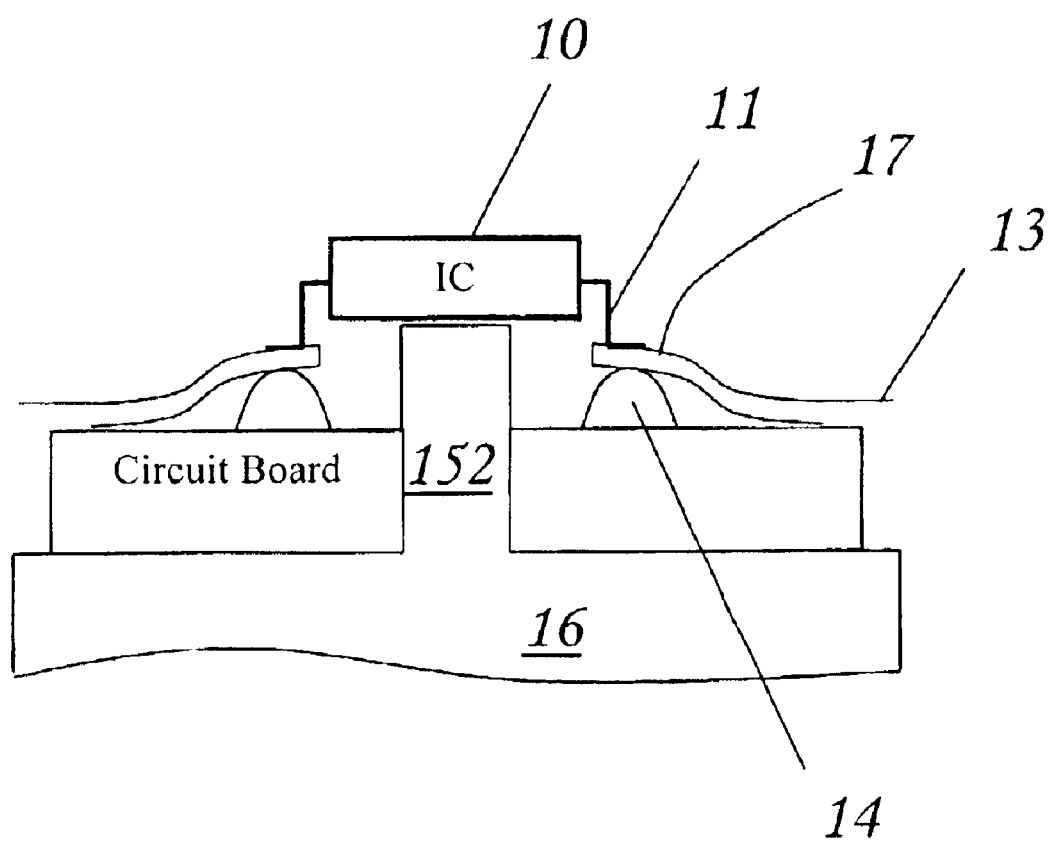
FIG. 7 shows the cross-section of a third embodiment of the present invention with a second kind of metal pedestals mounted between the testing pads for heat sinking and grounding.

FIG. 7 shows a third embodiment of the present invention. Instead of mounted a metallic pedestal 15 on the circuit board 12, a metallic pedestal 152 is protruded through the circuit board from a metallic base plate 16. The pedestal 152 is in contact with the IC 10 to serve as heat sink and ground connection.

Figure 8:
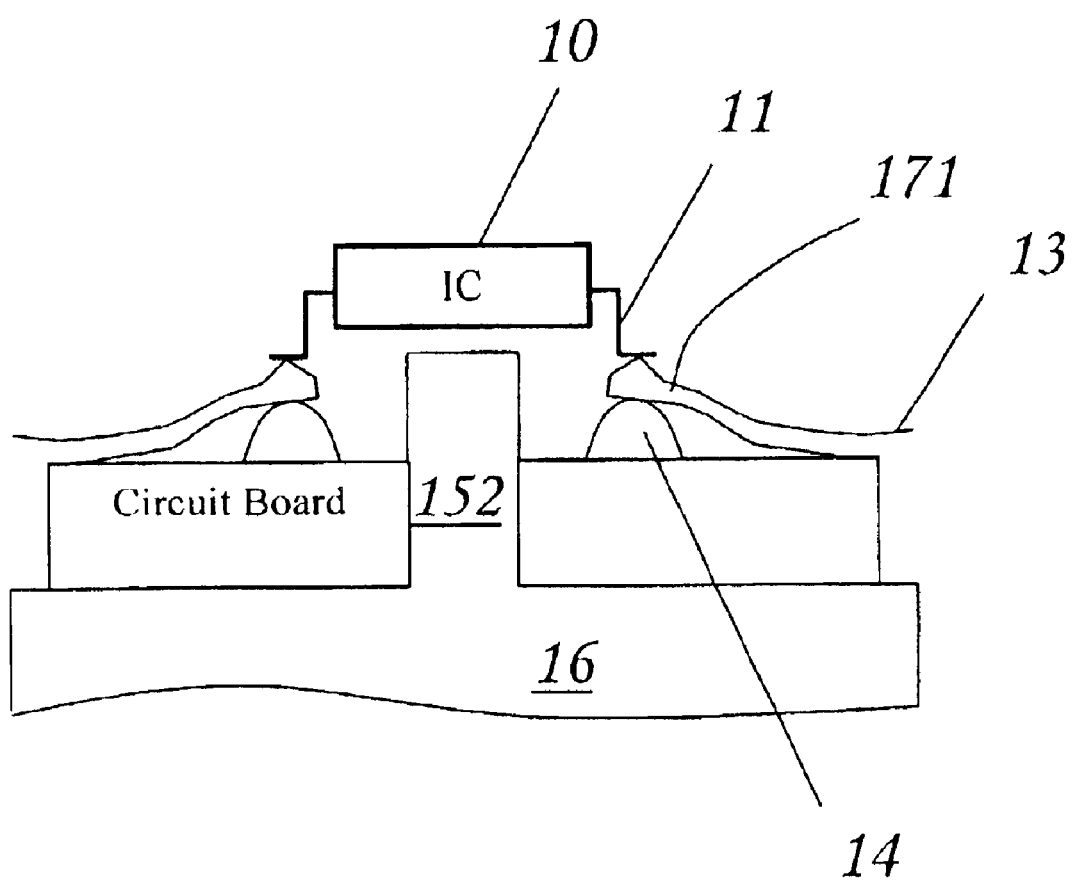
FIG. 8 shows the cross-section of a fourth embodiment of the present invention with pointed cantilever contacts.

FIG. 8 shows a fourth embodiment of the present invention. The structure is similar to that in FIG. 7, except that the contacts 171 of the cantilever is pointed as contrasted to the flat contacts 17 in FIG. 7. The pointed contacts improve the reliability of testing.

While the preferred embodiments of the present invention have been described, it will be apparent to those skilled in the art that various modifications may be made in these embodiments without departing from the spirit of the present invention. Such modifications are all within the scope of this invention.

What is claimed is:

1. A socket for testing integrated circuit, comprising:
   a circuit board on which an integrated circuit (IC) having at least two dual in-line leads is tested;
   at least two opposite in-line metallic cantilever beams mounted on said circuit board, inflexibly fixed to said circuit board at respective ends away from each other to said circuit board, and in direct contact at respective adjacent ends with the leads of said integrated circuit; and
   two non-conducting elastic cushions placed under the adjacent ends of said cantilever beams to cushion the pressure exerted by the leads of the IC.

2. The socket as described in claim 1, wherein said elastic cushions are selected from the group consisting of rubber, plastic and elastic material.

3. The socket as described in claim 1, wherein each one of said elastic cushion is common to multiple number of said in-line leads of said IC.

4. The socket as described in claim 1, further comprising a metallic pedestal mounted on said circuit board between said two elastic cushions, and in contact with the bottom of said IC to serve as a heat sink and common ground.

5. The socket as described in claim 1, further comprising a base plate having pedestals protruding through said circuit board between said two elastic cushions to contact the bottom of said IC under test and to serve as a heat sink and a common ground.

6. The socket as described in claim 1, wherein the adjacent ends of said cantilever beams are pointed needles to make point contacts with the leads of the IC under test.

* * * * *